United States Patent [19]

Yamagishi

[11] 4,062,103
[45] Dec. 13, 1977

[54] METHOD FOR MANUFACTURING A SEMICONDUCTOR DEVICE

[75] Inventor: Haruo Yamagishi, Fujisawa, Japan

[73] Assignee: Tokyo Shibaura Electric Co., Ltd., Tokyo, Japan

[21] Appl. No.: 609,899

[22] Filed: Sept. 2, 1975

[30] Foreign Application Priority Data

Sept. 14, 1974 Japan .................................. 49-106498

[51] Int. Cl.² .............................................. B01J 17/00
[52] U.S. Cl. ........................................ 29/580; 29/590; 29/591; 357/15; 427/84
[58] Field of Search ..................... 29/590, 591, 580; 357/15; 427/84; 148/1.5

[56] References Cited

U.S. PATENT DOCUMENTS

| 3,886,580 | 5/1975 | Calviello | 357/15 |
| 3,906,540 | 9/1975 | Hollins | 357/15 |

*Primary Examiner*—W. Tupman
*Attorney, Agent, or Firm*—Finnegan, Henderson, Farabow & Garrett

[57] ABSTRACT

A method comprises forming a Schottky barrier forming a metal layer on one surface of a gallium arsenide substrate using niobium, tantalum and/or vanadium to provide a Schottky barrier, and subjecting the Schottky barrier to heat treatment at 350° to 800° C so as to render it thermally stable.

6 Claims, 11 Drawing Figures

METHOD FOR MANUFACTURING A SEMICONDUCTOR DEVICE

This invention relates to a method for manufacturing a Schottky diode and, in particular, a semiconductor device using a gallium arsenide substrate.

This type of diode is commonly utilized as an IMPATT diode, mixer diode and varactor, which has an operating range including, for example, microwaves and millimeter waves. As a barrier forming material for such a Schottky diode, use has conventionally been made of a transistion metal such as titanium (Ti), molybdenum (Mo), platinum (Pt) and chromium (Cr). If a temperature is a Schottky barrier formed by these metals exceeds about 250° C, the result is lowered characteristic of a diode; a drop in the height of the Schottky barrier and an increase in $n$ value of forward characteristic (due partly to the drop in the height of the Schottky barrier). For the diode of this type, internal temperature often exceeds about 250° C during service, which would unavoidably involve lowered characteristic and shortened lifetime. For example, even if use is made of an IMPATT diode designed to make thermal resistance as low as possible, a temperature in the Schottky barrier reaches about 250° C with increasing output voltage. If the diode continues to be used under this state over a lengthy time period, the height of the Schottky barrier is lowered, resulting in the lowered oscillation characteristic of the diode.

It is accordingly the object of this invention to provide a method for manufacturing a semiconductor device having a thermally stable Schottky barrier i.e. not involving lowered characteristics even at a somewhat high temperature.

In an aspect of the invention there is provided a method for manufacturing a semiconductor device, comprising the steps of forming a Schottky barrier forming a metal layer on one surface of a gallium arsenide substrate using at least one kind selected from the group consisting of niobium, tantalum and vanadium to form a Schottky barrier therebetween, and subjecting the Schottky barrier to heat treatment at 350° to 800° C so as to make it thermally stable.

The Schottky barrier is formed utilizing the metal layer made of niobium, tantalum and/or vanadium, and subjected to heat treatment at 350° to 800° C so as to render it thermally stable. As a consequence, the characteristics of a diode are not lowered by an internal heat generated during service. The reason why these metals are used as a Schottky metal forming metal is based on the following findings: (1) an excellent Schottky barrier is formed and (2) the resultant Schottky barrier is thermally stable.

The preliminary heat treatment is based on the recognition that, once the diode is subjected to heat treatment, it will be little affected even if a high intensity of heat is generated during service. If heat is effected at a temperature less than 350° C, a length heating time will be required to obtain the effect of the heat treatment, with the attendant impracticability. At a temperature more than 800° C, crystal defect occurs in the substrate, resulting in lowered characteristics. The time for heat treatment, though different in treating temperature, is preferred to be in a range of 5 to 30 minutes, considered from the standpoint of manufacture as well as the characteristics of a diode. Under this condition, the treating temperature is preferably in a range of 400° to 600° C.

This invention can be more fully understood from the following detailed description when taken in conjunction with the accompanying drawings, in which:

FIG. 1 showing one manufacturing process and FIG. 2 showing the state after a final manufacturing process;

Figure 8:
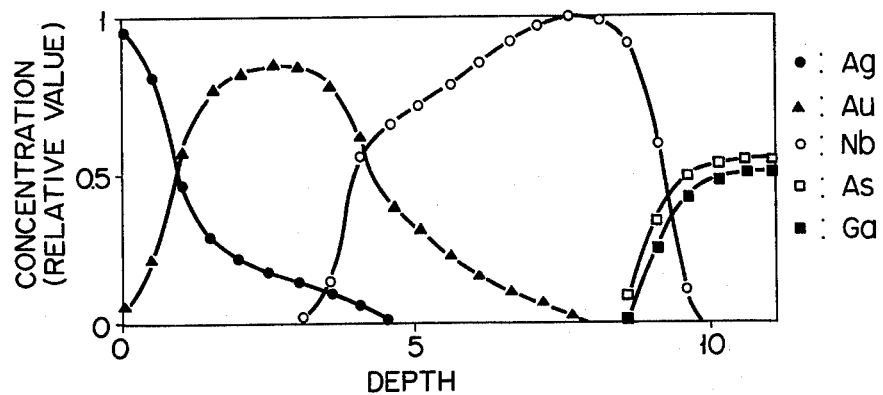
Figure 9:
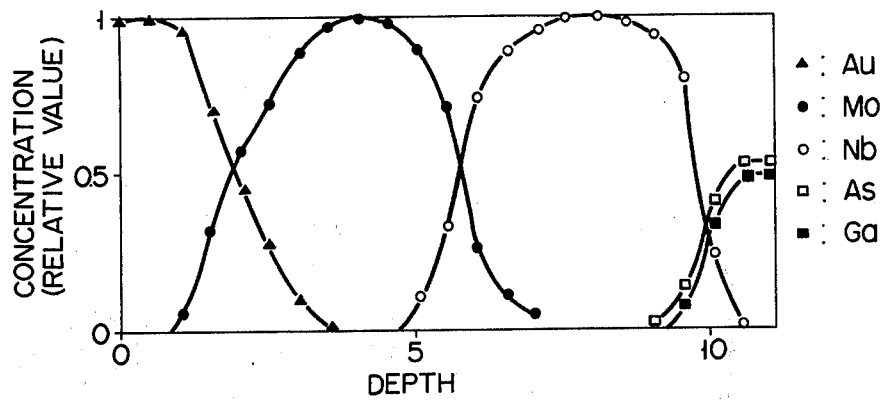
Figure 10:
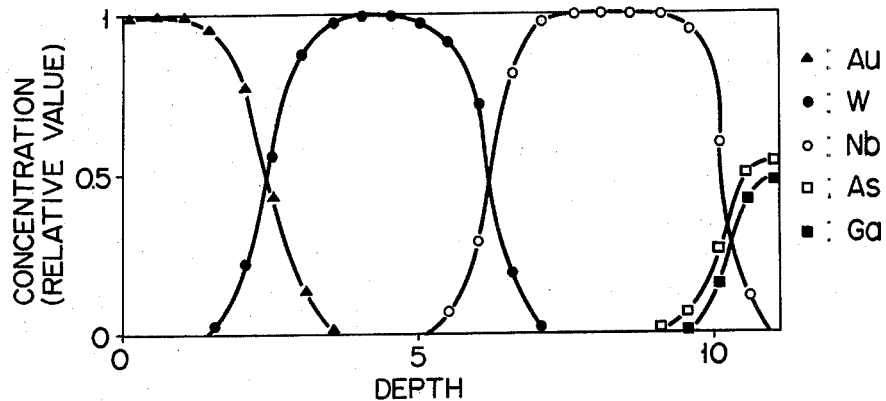
Figure 11:
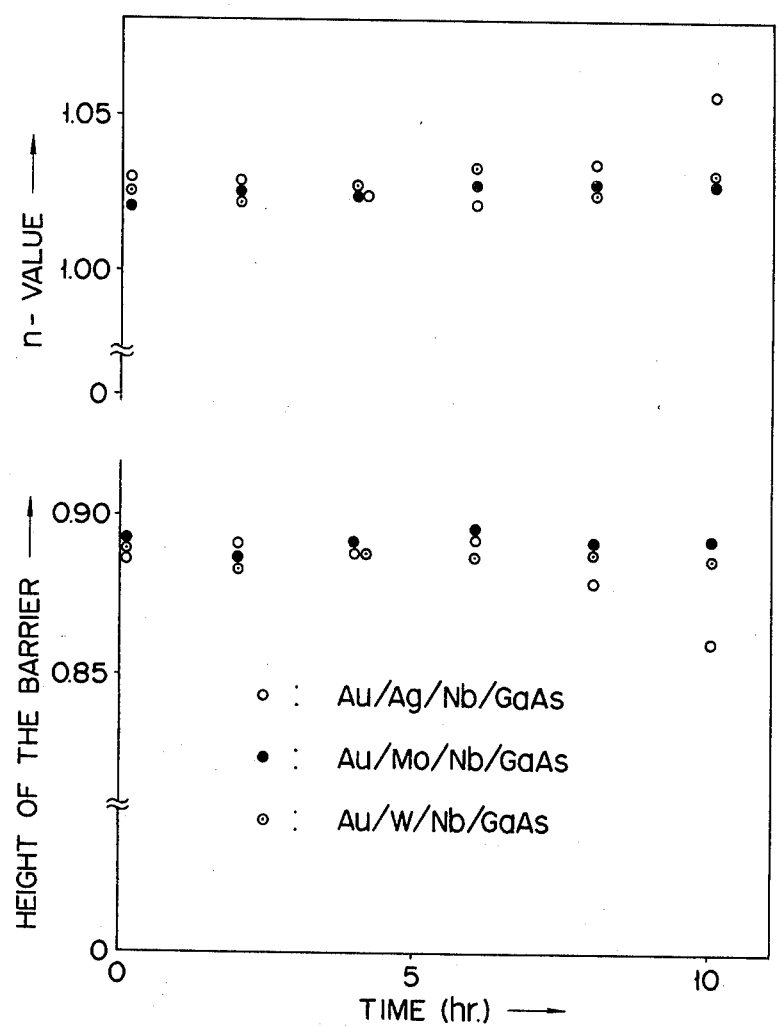

FIGS. 8 to 10 show concentration profiles of each component element of semiconductor devices so obtained in a direction of thickness of the devices, with Ag (FIG. 8), Mo (FIG. 9) and W (FIG. 10) being used as a blocking metal; and FIG. 11 is a diagram for plotting variation in $n$ value, as well as in the height of a Schottky barrier, against the time for heat treatment, as obtained when Ag, Mo and W are used as a blocking metal.

One embodiment of this invention will be explained by reference to the accompanying drawings.

Figure 1:
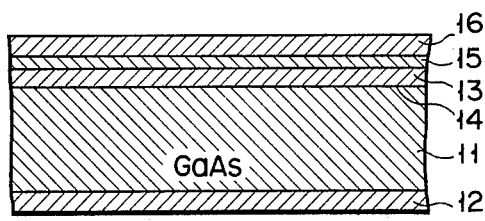
FIGS. 1 and 2 are cross-sectional views for explaining the manufacture of a semiconductor device according to one embodiment of this invention.

A selenium-, tellurium- or sulfur-doped gallium arsenide substrate 11 with an impurity concentration of $5 \times 10^{16}$ cm$^{-3}$ is prepared and an indium-germanium-silver alloy is attached to one surface of the substrate 11 to form an ohmic electrode 12. A niobium, tantalum, vanadium or an alloy thereof is attached on the other surface of the substrate 11 to form a metal layer 13 about 3000 A in thickness with a Schottky barrier 14 defined along a boundary between the metal layer 13 and the substrate 11. A molybdenum or tungsten layer 15 about 1500 A thick is formed on the Schottky metal layer 13 and a gold layer 16 about 4000 A thick is formed on the layer 15 (FIG. 1). In this embodiment, the metal layers 13, 15 and 16 are formed under a back pressure of $1 - 2 \times 10^{-7}$ Torr and a vacuum of $5 \times 10^{-7}$ (during evaporation) using an electron beam evaporation technique, but any other suitable method such as a known thin film technique etc. may be used in the formation of these metal layers.

The resultant GaAs substrate 11 as shown in FIG. 1 is inserted into a heat treating furnace and heat treated at 400° C for 30 minutes in a hydrogen gas stream. The temperature and the corresponding time are determined taking the following conditions into consideration: materials of which these layers are made; and the shape, kind etc. of a diode to be obtained. In this case, the temperature is determined within 350° to 800° C.

Figure 2:
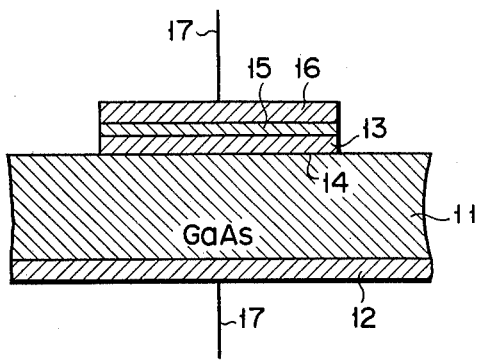

Then, the metal layers 13, 15 and 16 are partially removed by a common photoetching method, as shown in FIG. 2, to reduce the Schottky barrier to a predetermined area. A pair of lead-in wires 17 are connected one to the electrode 12 and the other to the electrode 16 to complete a Schottky diode.

Alternatively, the heating treatment of the substrate 11 and thus the Schottky barrier 14 may be made before the etching process of the metal layers 13, 15 and 16.

For the specimen using niobium as a Schottky metal, the Schottky barrier revealed the following characteristics: $n$ value was about 1.053 and the height of the Schottky barrier $\phi_B$ was about 0.86 eV. For experiment, the specimen was heat treated at 500° C for 2 hours in a hydrogen gas stream. As a result, $n$ value was about 1.048 and the height of the Schottky barrier $\phi_B$ was about 0.85 eV with a very small change in the characteristics of the Schottky barrier. This means that, even if a fairly high heat is developed, during service, at the Schottky barrier so obtained, the abovementioned Schottky barrier characteristics are little affected. For the specimen using tantalum as a Schottky metal the same experiment was conducted. Before heat treatment, $n$ value was about 1.050 and the height of the barrier $\phi_B$ was about 0.89 eV, whereas, after heat treatment, $n$ value was about 1.043 and the height of the barrier $\phi_B$ was about 0.97 eV. Substantially the same result was also observed for vanadium. In either case, the specimen exhibited an excellent stability against heat.

Figure 3:
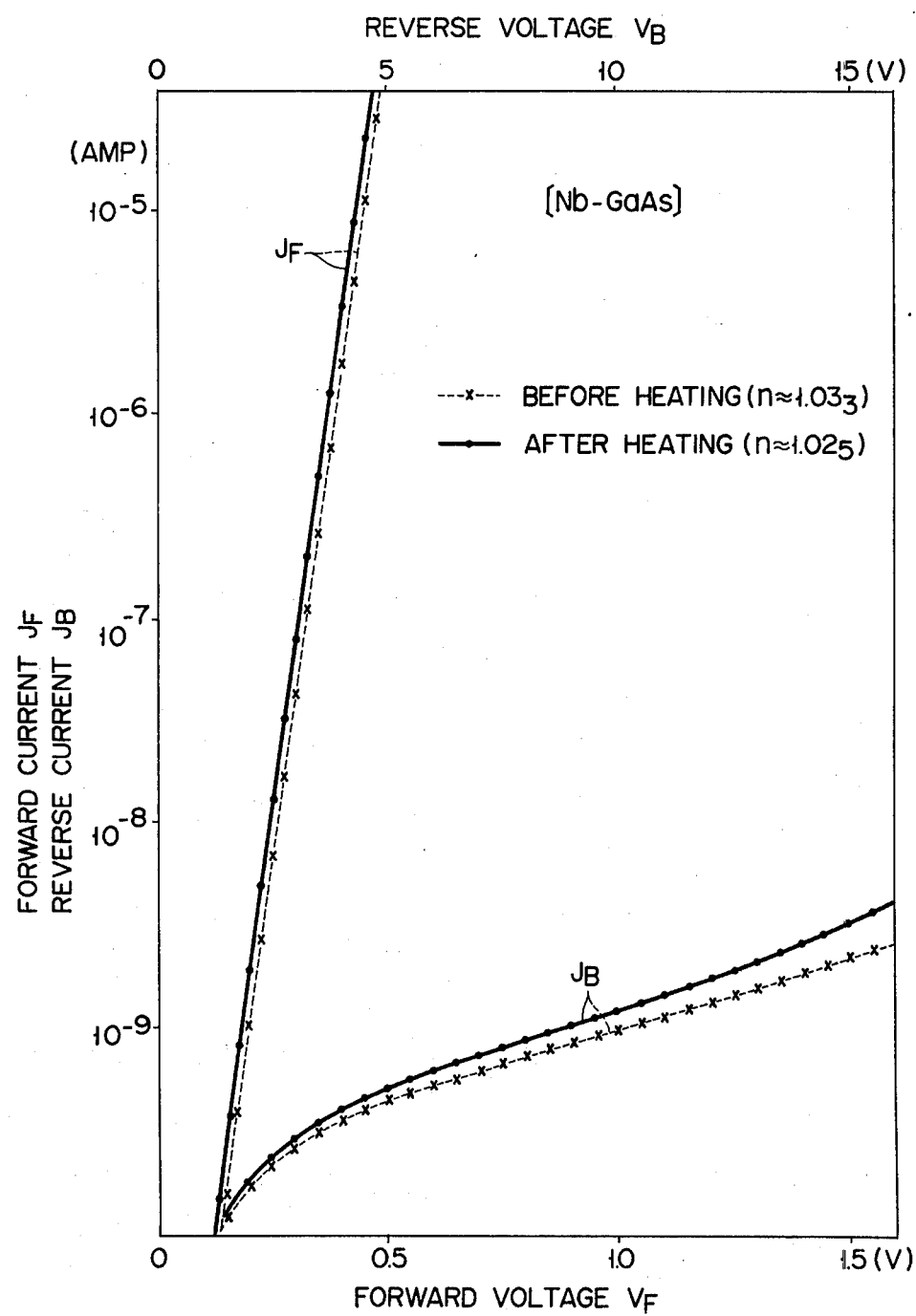
FIG. 3 is a current-voltage characteristic curve as obtaine before and after heat treatment of a Nb-GaAs type Schottky barrier diode manufactured according to the method of this invention.
Figure 4:
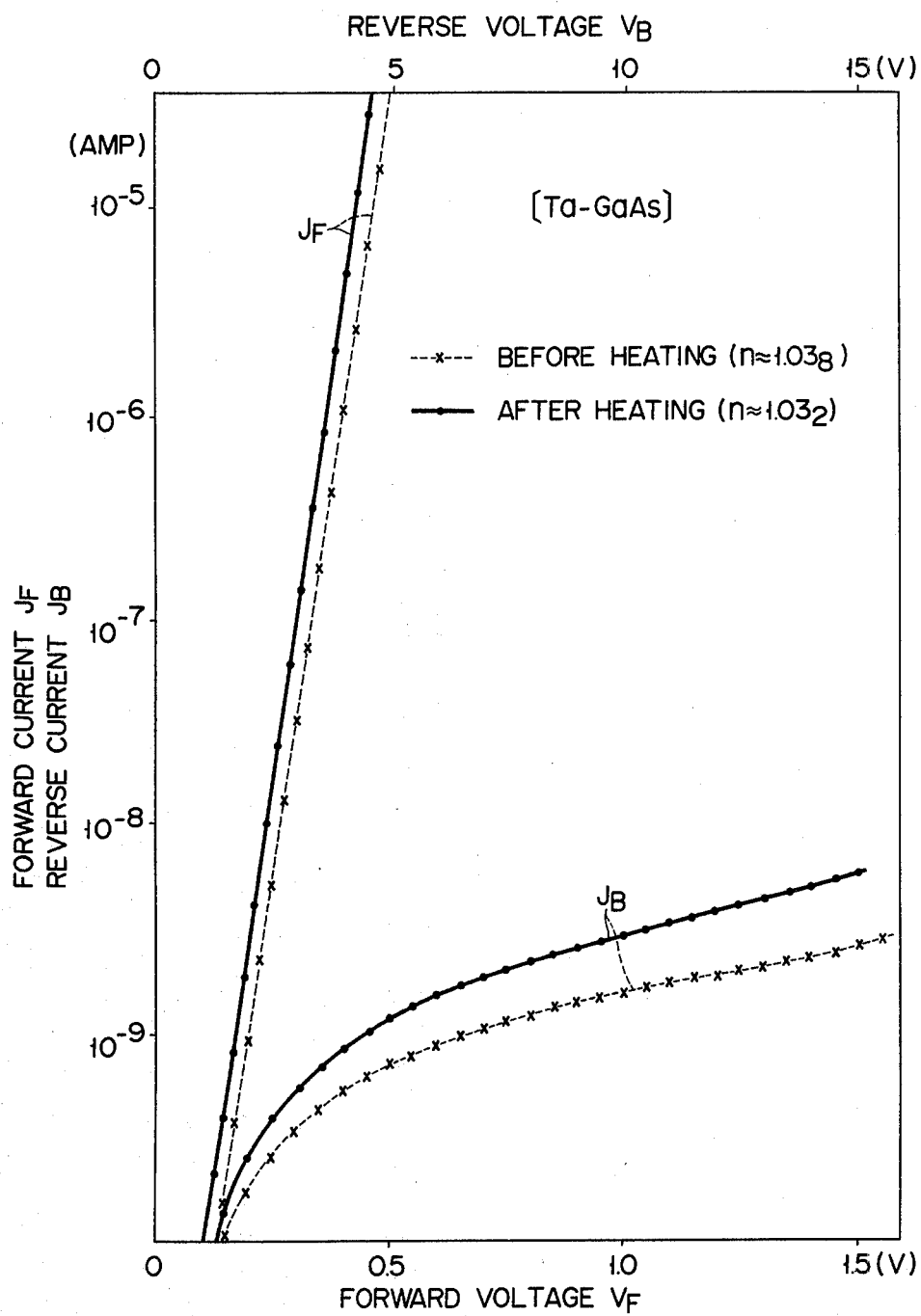
FIG. 4 is a characteristic curve, similar to that in FIG. 3, as obtained before and after heat treatment of a Ta-GaAs type Schottky barrier diode.

FIGS. 3 and 4 show current-voltage characteristic curves, as obtained before and after a heat treatment at 500° C for 2-hour of Schottky diodes using niobium and tantalum, respectively. In the diagrams, dotted lines indicate the characteristics of the diodes before the heat treatment ($n$ value is 1.033 in FIG. 3 and 1.038 in FIG. 4) and solid lines, the characteristics of the diodes after the heat treatment ($n$ value is 1.025 in FIG. 3 and 1.032 in FIG. 4). As will be appreciated from the current-voltage characteristic curve, the diode according to this invention shows a stable rectifying characteristic, particularly a stable forward current characteristic under a fairly high temperature.

Figure 5:
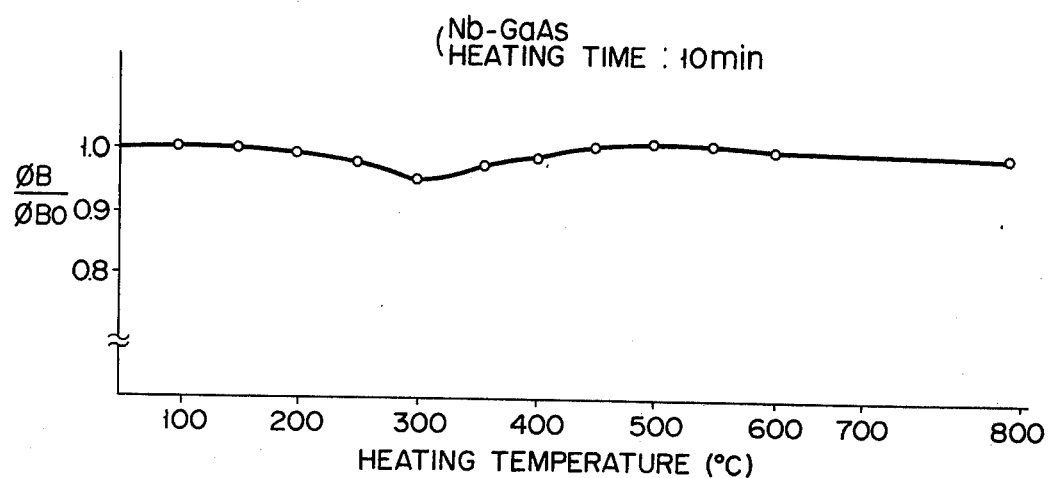
FIG. 5 is a curve showing a relation between the heat treating temperature and the height of a Schottky barrier as measured with respect to a Nb-GaAs type diode.
Figure 6:
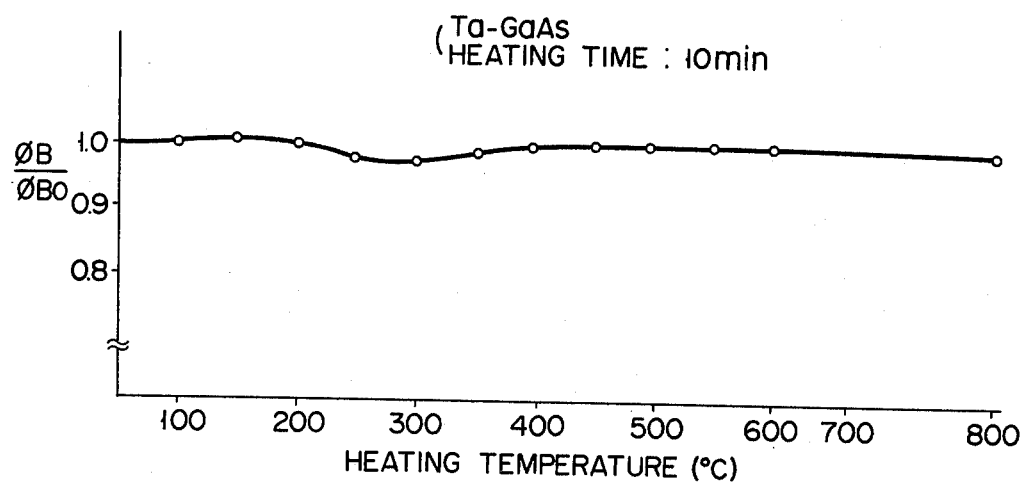
FIG. 6 is a curve, similar to that in FIG. 5, as obtained with respect to a Ta-GaAs type diode.

FIGS. 5 and 6 graphically show a variation in the height of a Schottky barrier as encountered in manufacturing a diode, as in the case of this invention, by heat treating it at a temperature of 350° to 800° C. In the graphic representation of FIGS. 5 and 6, the ordinate axis denotes the degree of variation $\phi_B/\phi_{B0}$ in the heights $\phi_{B0}$ and $\phi_B$ of the Schottky barrier as encountered before and after the heat treatment, respectively, and the abscissa denotes the heat treating temperature. FIG. 5 is for Nb-GaAs type diode and FIG. 6 is for Ta-GaAs type diode. The heat treatment was effected for 10 minutes. As will be evident from FIGS. 5 and 6, in either case, the height of the Schottky barrier is somewhat dropped at about 300° C, but at a temperature greater than about 350° C the height of the Schottky barrier is not varied.

For the characteristics as shown in FIGS. 5 and 6, $\phi_B$ is not greater than $\phi_{B0}$ and, except in the vicinity of 300° C, both the values $\phi_B$ and $\phi_{B0}$ are substantially equal to each other. When heat treatment is effected at 350° to 800° C, if the impurity concentration is suitably selected, there may occur the case where $\phi_B$ is greater than $\phi_{B0}$.

Figure 7:
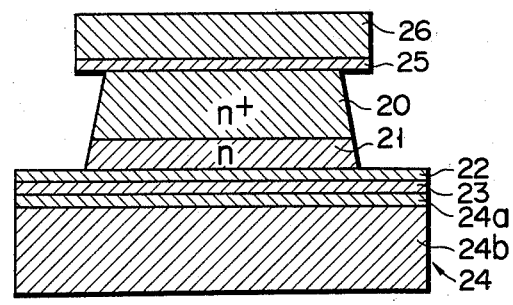
FIG. 7 is a cross-sectional view showing a semiconductor device according to another embodiment of this invention.

The other embodiment of this invention will now be explained in connection with an IMPATT diode by referring to FIG. 7.

A double layer type substrate is formed by chemical treating one surface of an $n^+$-type GaAS body 20 having a doner concentration of $2 \times 10^{18}$ cm$^{-3}$ and forming on the surface of the $n^+$-type GaAs body 20 an epitaxial growth $n$-type GaAs layer 21 with a doner concentration of $1 \times 10^{16}$ cm$^{-3}$. Then, an about 1500 Å thick layer 22 made of niobium i.e. a metal for forming a Schottky barrier, is formed at vacuum of about $8 \times 10^{-7}$ Torr on the $n$-type GaAs layer 21 using an electron beam evaporation method. A mo or W layer 23 is formed in thickness of about 2000 Å on the Nb layer 22 using the same method. A Au layer 24 is formed as an electrode on the Mo or W layer 23. The Au layer 24 is provided by forming a first layer 24a of about 4000 Å in thickness on the Mo or W layer 23 using an evaporation method and then a second layer 24b of about 1μ in thickness on the first layer 24a using a plating method. An In-Ge-Ag alloy layer 25 and Au layer 26 are formed in this order on the other surface of the $n^+$-type GaAs body 20. Then, the GaAs substrate alone is slantwise etched away around its outer periphery, as shown in FIG. 7, using a known photoresist method, thereby providing a mesa type substrate. After the above-mentioned etching treatment, the resultant substrate is heat treated at 500° C for 10 minutes in an atmosphere of a high impurity bearing Ar to yield an IMPATT diode. By this heat treatment a Nb-As or Nb-Ga intermetallic compound, or a Nb-As or Nb-Ga solid solution, is formed, thereby offering a stable Schottky barrier against heat. The heat treatment also assures an excellent ohmic contact between the GaAs substrate and the electrode.

The diode so obtained showed the following excellent characteristics; the height of the Schottky barrier $\phi_B$ was about 0.89 eV and $n$ value was about 1.02.

Since in the above-mentioned embodiment the Mo or W layer is interposed as a blocking layer between the Schottky metal layer and the Au layer, a thermal stability is enhanced in comparison with the case where, for example, a Ag layer is interposed as such. The reason for this is as follows:

Suppose that such a blocking layer is formed of Ag. When in this case the substrate is heat treated, for example, at a temperature of 500° to 800° C as selected from a temperature range 350° to 800° C, a Au-Ag alloy is formed, thus failing to perform a blocking function. In consequence, Au in the Au layer is penetrated through the Ag layer into the Schottky Nb layer, thereby exerting a bad influence on the Schottky barrier. Where, on the other hand, the blocking layer is formed of Mo or W, there is no fear that Au in the Au layer will be penetrated into the Schottky barrier forming metal. Even when the substrate is heat treated at about 500° C, Mo or W is not alloyed with the Schottky barrier forming metal.

Three specimens were manufactured, by the method as explained in connection with FIG. 7, using Ag, Mo and W as a blocking layer and allowed to stand at 500° C for 10 hours in an Ar atmosphere. FIGS. 8 to 10 show the concentration profile of each component element, i.e. Au, Ag (Mo, W), Nb (Schottky barrier forming metal), As, Ga, in each specimen as taken in a direction of depth of each specimen. The concentration profile of each component element was obtained on the Aujer electron spectroscopic analysis.

For the Ag blocking layer, as will be evident from FIG. 8, a complete Ag-Au alloy is formed and Au is penetrated into a Nb layer so that it is close to a GaAs crystal. Judging from this state, Au, if subjected to heat treatment at about 600° C, would reach the GaAs crystal with the consequent breakage to a Schottky barrier. Even where Au is penetrated, as mentioned above, closer to the GaAs crystal, the Schottky barrier is adversely affected, resulting in the lowered characteristics of the diode. For the Mo or W blocking layer, penetration of Au into a Nb layer does not occur as shown in FIGS. 9 and 10. It is less chance that each of Mo and W will be alloyed with Au.

In order to demonstrate the effect of Mo and W in comparison with Ag, specimens manufactured by the above-mentioned method were heat treated at 500° C in varying time, and a corresponding $n$ value as well as the height of the Schottky barrier was measured, the results of which are shown in FIG. 11. As will be understood from the experimental results, in the case of Ag, $n$ value gradually increases with an increase in heating time and, after the lapse of 10 hours, it exceeds 1.05. The height of the Schottky barrier gradually decreases with an increase in heating time. In the case of Mo and W, on the other hand, $n$ value as well as the height of the Schottky barrier is maintained at a suitable value irrespective of an increase in heating time.

In the above-mentioned methods it is preferred that the Schottky barrier forming metal layer be formed to have a thickness of 1000 to 3000 A. For the metal layer with a thickness less than 1000 A, there is a tendency for pinholes to be developed characteristic of the Schottky barrier, pinholes results in lowered characteristic of the Schottky barrier. Where on the other hand, the metal layer has a thickness of more than 3000 A, it tends to be peeled off the GaAs substrate.

The diode of the present invention may be constructed by a GaAs substrate, an insulating layer formed on the substrate with an opening exposing a part of said substrate, and a metal layer made of above mentioned material and formed on the exposed part of the substrate to form a Schottky barrier.

What is claimed is:

1. A method for manufacturing a semiconductor device comprising the steps of:
    forming a Schottky barrier metal layer of niobium on one surface of a gallium arsenide substrate to provide a Schottky barrier therebetween;
    forming a blocking metal layer on the Schottky barrier metal layer made of at least one material selected from the group consisting of molybdenum and tungsten;
    forming a gold electrode layer on the blocking metal layer, and then;
    subjecting the Schottky barrier to heat treatment at 350° to 800° C to make it thermally stable.

2. A method according to claim 1, in which said heat treating temperature is in a range of 400° to 600° C.

3. A method according to claim 1, which further includes the step of forming an ohmic electrode layer on the other surface of said gallium arsenide substrate before the heat treatment.

4. A method according to claim 3 which further includes the step of subjecting the gallium arsenide substrate to mesa etching.

5. A method according to claim 3 which further includes the step of partially removing said Schottky barrier metal layer, said blocking metal layer and said electrode layer by means of etching to reduce the Schottky barrier to a predetermined dimension.

6. A method according to claim 1 in which said Schottky barrier metal has a thickness of 1000 to 3000 A.

* * * * *